United States Patent
Kang et al.

(10) Patent No.: US 10,412,324 B2
(45) Date of Patent: Sep. 10, 2019

(54) INFRARED IMAGE RECONSTRUCTION METHOD BASED ON BLOCK-SPARSE COMPRESSIVE SENSING AND SYSTEM THEREOF

(71) Applicant: SHENZHEN UNIVERSITY, Shenzhen, Guangdong (CN)

(72) Inventors: Li Kang, Guangdong (CN); Runqing Liang, Guangdong (CN); Jianjun Huang, Guangdong (CN); Jingxiong Huang, Guangdong (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 31 days.

(21) Appl. No.: 15/913,945

(22) Filed: Mar. 7, 2018

(65) Prior Publication Data
US 2018/0198992 A1    Jul. 12, 2018

Related U.S. Application Data

(63) Continuation of application No. PCT/CN2016/097318, filed on Aug. 30, 2016.

(51) Int. Cl.
| | |
|---|---|
| H04N 5/33 | (2006.01) |
| H04N 19/85 | (2014.01) |
| H03M 7/30 | (2006.01) |
| H04N 19/176 | (2014.01) |
| H04N 19/136 | (2014.01) |

(Continued)

(52) U.S. Cl.
CPC ............ H04N 5/33 (2013.01); G06T 5/50 (2013.01); H03M 7/3062 (2013.01); H04N 19/136 (2014.11); H04N 19/176 (2014.11); H04N 19/85 (2014.11); H04N 19/90 (2014.11);

(Continued)

(58) Field of Classification Search
CPC ........ H04N 19/85; H04N 5/33; H04N 19/136; H04N 19/176; H04N 19/90; G06T 2207/10048; G06T 2207/20081; G06T 5/20; G06T 5/50; H03M 7/3062
See application file for complete search history.

(56) References Cited

FOREIGN PATENT DOCUMENTS

CN         105007498 A    * 10/2015

* cited by examiner

*Primary Examiner* — Anand S Rao
*Assistant Examiner* — Tyler B Edwards

(57) ABSTRACT

The present invention provides an infrared image reconstruction method based on block-sparse compressive sensing. The method includes: a block-sparse representation step: representing consecutive infrared small target image sequences as signals having block-sparse characteristics; a temporal correlation modeling step: modeling a temporal correlation of data between the consecutive infrared small target image sequences under a Bayesian framework; and a signal reconstruction and output step: reconstructing infrared small target images using a sparse learning algorithm and outputting final estimates of the signals. The present invention further provides an infrared image reconstruction system based on block-sparse compressive sensing. According to the technical solution provided in the present invention, in the process of reconstruction by compressive sensing, signals are reconstructed using a correlation of consecutive signals in time, such that the reconstruction precision of a single frame of signal can be improved, and the algorithm running time is significantly reduced.

8 Claims, 3 Drawing Sheets

(51) Int. Cl.
*H04N 19/90* (2014.01)
*G06T 5/50* (2006.01)
(52) U.S. Cl.
CPC ............... *G06T 2207/10048* (2013.01); *G06T 2207/20081* (2013.01)

INFRARED IMAGE RECONSTRUCTION METHOD BASED ON BLOCK-SPARSE COMPRESSIVE SENSING AND SYSTEM THEREOF

CROSS-REFERENCE TO RELATED APPLICATIONS

This application is a Continuation application of PCT Application No. PCT/CN2016/097318, filed on Aug. 30, 2016, the entire contents of which are hereby incorporated by reference.

TECHNICAL FIELD

The present invention relates to the field of infrared imaging, and in particular, to an infrared image reconstruction method based on block-sparse compressive sensing and a system thereof.

BACKGROUND

Infrared imaging techniques have extensive and important applications in military and civilian fields. With the development and popularization of infrared imaging techniques, network transmission for infrared images has become the foundation for numerous applications and meanwhile the bottleneck for the development of these applications.

For promoting the application of infrared techniques, an urgent problem to be solved is to improve the transmission efficiency for the infrared images under a limited bandwidth. Data compression techniques based on compressive sensing (CS) have been a new direction in the field of data compression in recent years.

In view of the current research at home and abroad, applications of compressive sensing techniques in image processing mostly focus on an image itself for sensing of compression and reconstruction without considering the temporal correlation in time sequence between consecutive frames. However, such temporal correlation is common for sequential images in practice. Therefore, compressive sensing methods in the prior art have the defects of poor reconstruction precision and low compression efficiency.

SUMMARY

Accordingly, the present invention is directed to an infrared image reconstruction method based on block-sparse compressive sensing and a system thereof, which intends to solve the problem of poor reconstruction precision and low compression efficiency existing in the compressive sensing methods in the prior art.

The present invention provides an infrared image reconstruction method based on block-sparse compressive sensing, which mainly includes:
a block-sparse representation step: representing consecutive infrared small target image sequences as signals having block-sparse characteristics;
a temporal correlation modeling step: modeling a temporal correlation of data between the consecutive infrared small target image sequences under a Bayesian framework; and
a signal reconstruction and output step: reconstructing infrared small target images using a sparse learning algorithm and outputting final estimates of the signals.

In addition, the present invention further provides an infrared image reconstruction system based on block-sparse compressive sensing, which includes:
a block-sparse representation module, configured to represent consecutive infrared small target image sequences as signals having block-sparse characteristics;
a temporal correlation modeling module, configured to model a temporal correlation of data between the consecutive infrared small target image sequences under a Bayesian framework; and
a signal reconstruction and output module, configured to reconstruct infrared small target images using a sparse learning algorithm and output final estimates of the signals.

According to the technical solution provided in the present invention, a temporal correlation between sequences is modeled, signal reconstruction is implemented using such temporal correlation under a Bayesian framework, and in the process of reconstruction by compressive sensing, signals are reconstructed using a correlation of consecutive signals in time, such that the reconstruction precision of a single frame of signal can be improved, and the algorithm running time is significantly reduced, thereby greatly improving the compression efficiency.

DESCRIPTION OF THE EMBODIMENTS

In order to make the objectives, technical solutions and advantages of the present invention more clear, the present invention is further described in detail below with reference to the accompanying drawings and embodiments. It should be understood that the specific embodiments described herein are used for only explaining the present invention, rather than limiting the present invention.

An infrared image reconstruction method based on block-sparse compressive sensing provided in the present invention will be described in detail below.

Figure 1:
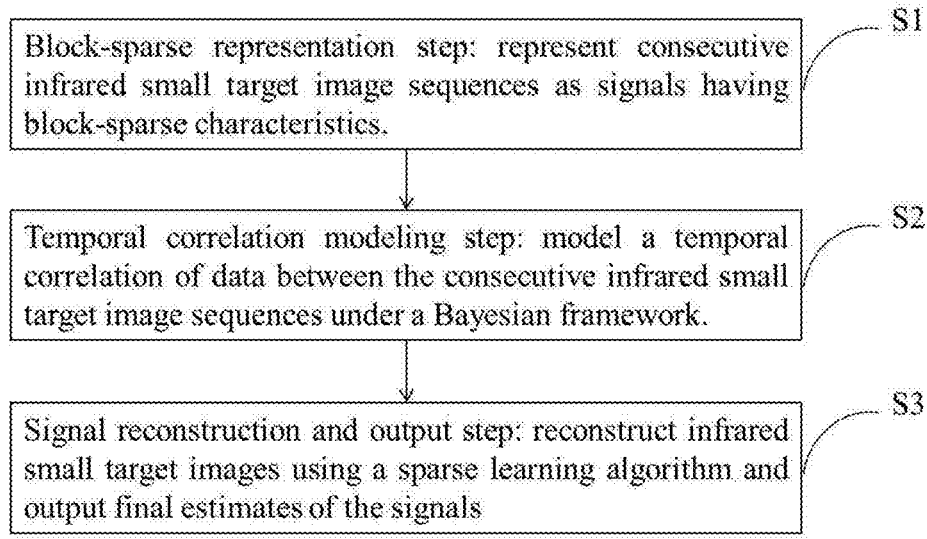
FIG. 1 is a flowchart of an infrared image reconstruction method based on block-sparse compressive sensing according to an embodiment of the present invention.

Referring to FIG. 1, it is a flowchart of an infrared image reconstruction method based on block-sparse compressive sensing according to an embodiment of the present invention.

Step S1, a block-sparse representation step: represent consecutive infrared small target image sequences as signals having block-sparse characteristics.

In this embodiment, the block-sparse representation step S1 specifically includes:
representing a multiple-measurement vector model $Y=\Phi X+V$ using consecutive infrared small target image sequence signals and a block-sparse matrix, where the infrared small target image signals are $x, x \in$ $\mathbb{R}^{M\times 1}$, the block-sparse matrix is $X=\{x_1, x_2, \ldots, x_L\}$, $X\in\mathbb{R}^{M\times L}$, $Y\triangleq[y^{(.1)}, \ldots, y^{(.L)}]\in\mathbb{R}^{N\times L}$ is an observation matrix, $X\triangleq[x^{(.1)}, \ldots, x^{(.L)}]\in\mathbb{R}^{M\times L}$, $\Phi\in\mathbb{R}^{N\times M}$ is a known dictionary matrix, V is a noise matrix, $y^{(.i)}$ is an $i^{th}$ column of Y, and $x^{(.i)}$ is an $i^{th}$ column of X; and converting the multiple-measurement vector model into a single-measurement vector model y=Dx+v, where in the multiple-measurement vector model, the block-sparse matrix X is constituted by consecutive frames $x_i$(i=1, 2, ..., L) having a temporal correlation, $x^{(i.)}$(i=1, ..., M) are independent of each other, $x^{(i.)}$ is an $i^{th}$ row of X, let $y=\text{vec}(Y^T)\in\mathbb{R}^{NL\times 1}$, $x=\text{vec}(X^T)\in\mathbb{R}^{ML\times 1}$, where $D=\Phi\otimes I_L$, $I_L$ is an L-dimension unit matrix, and x is a block-sparse signal and may be represented as $$x = \left[\underbrace{x_1 \ldots x_L}_{x^T[1]} \underbrace{x_2 \ldots x_{2L}}_{x^T[2]} \ldots \underbrace{x_{J-L+1} \ldots x_J}_{x^T[M]}\right]^T,$$

where J=M×L.

Step S2, a temporal correlation modeling step: model a temporal correlation of data between the consecutive infrared small target image sequences under a Bayesian framework.

In this embodiment, the temporal correlation modeling step S2 specifically includes:

in the multiple-measurement vector model in step S1, assuming $X_{i\cdot}$ are independent of each other and comply with a Gaussian distribution: $p(X_{i\cdot};\gamma_i,B_i)\sim N(0,\gamma_i B_i)$, where a super-parameter $\gamma_i$ controls the sparseness of the vectors $X_{i\cdot}$, and $B_i$ is a positive definite matrix that describes a time correlation structure of $X_{i\cdot}$ and is a parameter to be estimated, assuming a priori of the sparse vector x is $p(x;\gamma_i,B_i)\sim N(0,\Sigma_0)$, and modeling a temporal correlation of data between the consecutive infrared small target image sequences under a Bayesian framework, where $\gamma_i$ is a non-negative super-parameter, $$\Sigma_0 = \begin{bmatrix} \gamma_1 B_1 & & \\ & \ddots & \\ & & \gamma_M B_M \end{bmatrix},$$

and the time structure of the signals is described with a prior density for constructing the matrix $B_i$.

In this embodiment, as compared with a traditional reconstruction method (for example, matching pursuit or orthogonal matching pursuit), reconstruction in compressive sensing under a Bayesian framework not only can improve the reconstruction precision but also can obtain a posterior estimate of a sparse solution.

In this embodiment, for the sparse signal $x, x\in R^{M\times 1}$, a compressive sensing model thereof may be represented by the following equation: y=Φx+v. In the equation, $y\in R^{N\times 1}$ is a compressive observation vector, $\Phi\in R^{N\times M}$ is an observation matrix, and v is a noise vector. After the sparse signal x is subjected to compressive observation through the observation matrix, an observed signal y with a dimension greatly lowered can be obtained, and the low-dimension observed signal contains sufficient information for recovering the original sparse signal x.

In the Bayesian compressive sensing theory, the observation is represented from the perspective of probability as follows:

$$y=\Phi x=\Phi x_s+x_e+x_o=\Phi x_s+n,$$

where $n_e=\Phi w_e$, $w_e=w-w_s$, $n_o$ is process noise of the observation y, they both are represented by n in a unified manner, and $n\sim N(0,\sigma^2)$ may be described using a zero-mean Gaussian distribution. Correspondingly, a Gaussian likelihood model in regard to a random variable y may be represented as follows:

$$p(y|x_s, \sigma^2) = (2\pi\sigma^2)^{-K/2}\exp\left(-\frac{1}{2\sigma^2}\|y-\Phi x_s\|^2\right).$$

In the above equation, if $\Phi$ is known, estimates based on the observation y are $x_s$ and $\sigma^2$. The implementation of signal reconstruction using a Bayesian method is a process of solving a posterior probability density function of $x_s$ and $\sigma^2$ under the condition that the observation y is known, where $x_s$ has sparseness and can be introduced into the solving process as prior information of the problem, and a problem solution can be obtained using the prior information.

Step S3, a signal reconstruction and output step: reconstruct infrared small target images using a sparse learning algorithm and output final estimates of the signals.

In this embodiment, the signal reconstruction and output step S3 specifically includes:

under the condition that the observation y is known, obtaining a posterior estimate of the sparse vector x using the Bayesian method: $p(x|y;\sigma^2,\gamma_i,B_i)\sim N(\mu_x,\Sigma_x)$, where a Gaussian likelihood function of the observation y is:

$$p(y|x,\sigma^2) = (2\pi\sigma^2)^{-N/2}\exp\left(-\frac{1}{2\sigma^2}\|y-Dx\|^2\right),$$

where $$\mu_x = \frac{1}{\sigma^2}\Sigma_x D^T y$$

and $\Sigma_x=\Sigma_0-\Sigma_0 D^T(\sigma^2 I+D\Sigma_0 D^T)^{-1}D\Sigma_0$; and estimating the super-parameter in the above equation through a maximum likelihood method or an expectation maximization method:

$$\gamma_i = \frac{Tr[B^{-1}(\Sigma_x^i + \mu_x^i(\mu_x^i)^T)]}{L}, i=1,\ldots,M,$$

$$B = \frac{1}{M}\sum_{i=1}^{M}\frac{\Sigma_x^i + \mu_x^i(\mu_x^i)^T}{\gamma_i}, i=1,\ldots,M,$$

$$\sigma^2 = \frac{\|y-D\mu_x\|_2^2 + \sigma'^2[ML-Tr(\Sigma_x\Sigma_0^{-1})]}{NL},$$

and outputting final estimates of the signals after the iteration ends.

In this embodiment, a temporal correlation of data between consecutive frames is common for video data, and if such correlation of signals in time can be applied to compressive sensing of signals, the reconstruction precision of a signal can be improved.

In this embodiment, assuming infrared small target image signals are $x, x \in \mathbb{R}^{M \times 1}$, a block-sparse matrix is $X, X \in \mathbb{R}^{M \times L}$, which is constituted by consecutive frames $x_i (i=1, 2, \ldots, L)$ having a temporal correlation, and a multiple-measurement vector model may be described as $Y=\Phi X+V$, where $Y \in \mathbb{R}^{N \times L}$, $\Phi \in \mathbb{R}^{N \times M}$, and V is a noise matrix.

In the aforementioned multiple-measurement vector model, assuming $X_{i\cdot}$ are independent of each other and comply with a Gaussian distribution:

$$p(X_{i\cdot}; \gamma_i, B_i) \sim N(0, \gamma_i B_i), i=1,2, \ldots, M,$$

where the super-parameter $\gamma_i$ controls the sparseness of the vectors $X_{i\cdot}$, $B_i$ is a positive definite matrix that describes a time correlation structure of $X_{i\cdot}$ and is a parameter to be estimated, and the multiple-observation model may be converted into the form of a single-observation model:

$$y = Dx + v,$$

where $y \in \mathbb{R}^{NL \times 1}$, $x \in \mathbb{R}^{ML \times 1}$ and $D = \Phi \otimes I_L$. Then, a Gaussian likelihood function of the observation y in the equation $y=Dx+v$ is:

$$p(y \mid x, \sigma^2) = (2\pi\sigma^2)^{-N/2} \exp\left(-\frac{1}{2\sigma^2} \|y - Dx\|^2\right).$$

Assuming the prior of the sparse vector x is:

$$p(x; \gamma_i, B_i) \sim N(0, \Sigma_0), \text{ where } \Sigma_0 = \begin{bmatrix} \gamma_1 B_1 & & \\ & \ddots & \\ & & \gamma_M B_M \end{bmatrix}.$$

Under the condition that the observation y is known, a posterior estimate of the sparse vector x may be obtained using the Bayesian method:

$$p(x \mid y; \sigma^2, \gamma_i, B_i) \sim N(\mu_x, \Sigma_x), \text{ where } \mu_x = \frac{1}{\sigma^2} \Sigma_x D^T y \text{ and}$$

$$\Sigma_x = \Sigma_0 - \Sigma_0 D^T (\sigma^2 I + D\Sigma_0 D^T)^{-1} D\Sigma_0.$$

The super-parameter in the above equation may be estimated through a type-II maximum likelihood method or an EM (expectation maximization) method:

$$\gamma_i = \frac{Tr[B^{-1}(\Sigma_x^i + \mu_x^i(\mu_x^i)^T)]}{L}, i=1, \ldots, M;$$

$$B = \frac{1}{M} \sum_{i=1}^{M} \frac{\Sigma_x^i + \mu_x^i(\mu_x^i)^T}{\gamma_i}, i=1, \ldots, M;$$

$$\sigma^2 = \frac{\|y - D\mu_x\|_2^2 + \sigma'^2 [ML - Tr(\Sigma_x \Sigma_0^{-1})]}{NL}.$$

As compared with the Bayesian compressive sensing method in the single-observation model, the aforementioned multiple-observation model describes a correlation of signals in time and uses one positive definite matrix to describe such a correlation structure. In the process of sequence signal reconstruction, Bayesian inference is performed on the positive definite matrix, so as to solve sparse coefficients.

According to an infrared image reconstruction method based on block-sparse compressive sensing provided in the present invention, a temporal correlation between sequences is modeled, signal reconstruction is implemented using such temporal correlation under a Bayesian framework, and in the process of reconstruction by compressive sensing, signals are reconstructed using a correlation of consecutive signals in time, such that the reconstruction precision of a single frame of signal can be improved, and the algorithm running time is significantly reduced, thereby greatly improving the compression efficiency.

Figure 2:
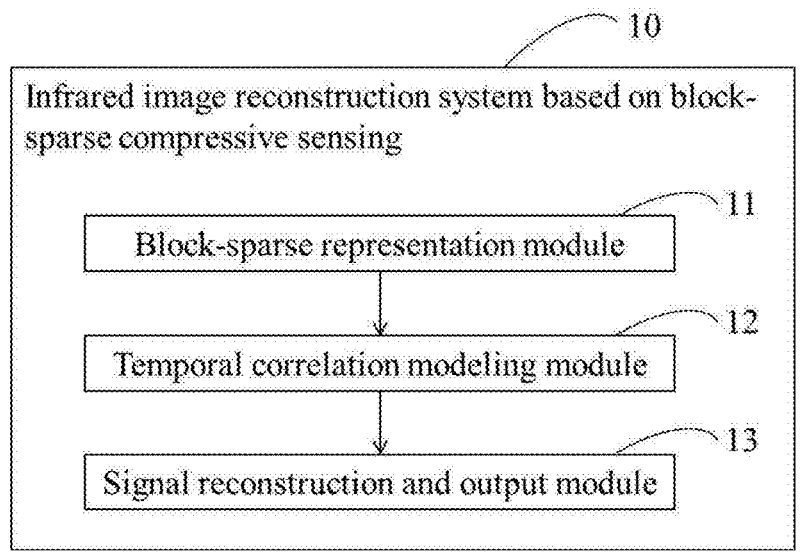
FIG. 2 is a schematic diagram illustrating an internal structure of an infrared image reconstruction system 10 based on block-sparse compressive sensing according to an embodiment of the present invention.

Referring to FIG. 2, it is a schematic structural diagram of an infrared image reconstruction system 10 based on block-sparse compressive sensing according to an embodiment of the present invention.

In this embodiment, the infrared image reconstruction system 10 based on block-sparse compressive sensing mainly includes a block-sparse representation module 11, a temporal correlation modeling module 12, and a signal reconstruction and output module 13.

The block-sparse representation module 11 is configured to represent consecutive infrared small target image sequences as signals having block-sparse characteristics.

In this embodiment, the block-sparse representation module 11 is specifically configured to:
represent a multiple-measurement vector model $Y=\Phi X+V$ using consecutive infrared small target image sequence signals and a block-sparse matrix, where the infrared small target image signals are $x, x \in \mathbb{R}^{M \times 1}$, the block-sparse matrix is $X = \{x_1, x_2, \ldots, x_L\}$, $X \in \mathbb{R}^{M \times L}$, $Y \triangleq [y^{(.1)}, \ldots, y^{(.L)}] \in \mathbb{R}^{N \times L}$ is an observation matrix, $X \triangleq [x^{(.1)}, \ldots, x^{(.L)}] \in \mathbb{R}^{M \times L}$, $\Phi \in \mathbb{R}^{N \times M}$ is a known dictionary matrix, V is a noise matrix, $y^{(.i)}$ is an $i^{th}$ column of Y, and $x^{(.i)}$ is an $i^{th}$ column of X; and
convert the multiple-measurement vector model into a single-measurement vector model $y=Dx+v$, where in the multiple-measurement vector model, the block-sparse matrix X is constituted by consecutive frames $x_i (i=1, 2, \ldots, L)$ having a temporal correlation, $x^{(i.)} (i=1, \ldots, M)$ are independent of each other, $x^{(i.)}$ is an $i^{th}$ row of X, let $y=\text{vec}(Y^T) \in \mathbb{R}^{NL \times 1}$, $x=\text{vec}(X^T) \in \mathbb{R}^{ML \times 1}$, where $D=\Phi \otimes I_L$, $I_L$ is an L-dimension unit matrix, and x is a block-sparse signal and may be represented as $$x = \begin{bmatrix} \underbrace{x_1 \ldots x_L}_{x^T[1]} & \underbrace{x_2 \ldots x_{2L}}_{x^T[2]} & \cdots & \underbrace{x_{J-L+1} \ldots x_J}_{x^T[M]} \end{bmatrix}^T,$$

where $J=M \times L$.

The temporal correlation modeling module 12 is configured to model a temporal correlation of data between the consecutive infrared small target image sequences under a Bayesian framework.

In this embodiment, the temporal correlation modeling module 12 is specifically configured to:
in the multiple-measurement vector model of the block-sparse representation module 11, assume $X_{i\cdot}$ are independent of each other and comply with a Gaussian distribution: $p(X_{i\cdot}; \gamma_i, B_i) \sim N(0, \gamma_i B_i)$, where a super-parameter $\gamma_i$ controls the sparseness of the vectors $X_{i\cdot}$, and $B_i$ is a positive definite matrix that describes a time correlation structure of $X_{i\cdot}$ and is a parameter to be estimated, assume a priori of the sparse vector x is $p(x;\gamma_i,B_i) \sim N(0,\Sigma_0)$, and model a temporal correlation of data between the consecutive infrared small target image sequences under a Bayesian framework, where $\gamma_i$ is a non-negative super-parameter, $$\Sigma_0 = \begin{bmatrix} \gamma_1 B_1 & & \\ & \ddots & \\ & & \gamma_M B_M \end{bmatrix},$$

and the time structure of the signals is described with a prior density for constructing the matrix $B_i$.

The signal reconstruction and output module 13 is configured to reconstruct infrared small target images using a sparse learning algorithm and output final estimates of the signals.

In this embodiment, the signal reconstruction and output module 13 is specifically configured to:

under the condition that an observation y is known, obtain a posterior estimate of the sparse vector x using a Bayesian method: $p(x|y;\sigma^2,\gamma_i,B_i) \sim N(\mu_x,\Sigma_x)$, where a Gaussian likelihood function of the observation y is:

$$p(y|x,\sigma^2) = (2\pi\sigma^2)^{-N/2} \exp\left(-\frac{1}{2\sigma^2}\|y - Dx\|^2\right),$$

where $$\mu_x = \frac{1}{\sigma^2}\Sigma_x D^T y \text{ and } \Sigma_x = \Sigma_0 - \Sigma_0 D^T(\sigma^2 I + D\Sigma_0 D^T)^{-1}D\Sigma_0;$$

and estimate the super-parameter in the above equation through a maximum likelihood method or an expectation maximization method:

$$\gamma_i = \frac{Tr[B^{-1}(\Sigma_x^i + \mu_x^i(\mu_x^i)^T)]}{L}, i = 1, \ldots, M,$$

$$B = \frac{1}{M}\sum_{i=1}^{M}\frac{\Sigma_x^i + \mu_x^i(\mu_x^i)^T}{\gamma_i}, i = 1, \ldots, M,$$

$$\sigma^2 = \frac{\|y - D\mu_x\|_2^2 + \sigma'^2[ML - Tr(\Sigma_x\Sigma_0^{-1})]}{NL},$$

and output final estimates of the signals after the iteration ends.

According to the infrared image reconstruction system 10 based on block-sparse compressive sensing provided in the present invention, through such modules as the block-sparse representation module 11, the temporal correlation modeling module 12, and the signal reconstruction and output module 13, a temporal correlation between sequences is modeled, signal reconstruction is implemented using such temporal correlation under a Bayesian framework, and in the process of reconstruction by compressive sensing, signals are reconstructed using a correlation of consecutive signals in time, such that the reconstruction precision of a single frame of signal can be improved, and the algorithm running time is significantly reduced, thereby greatly improving the compression efficiency.

In order to test the application of the algorithm of the present invention in sequential data, simulated data and measured data are separately used below for verification in the present invention.

Figure 3:
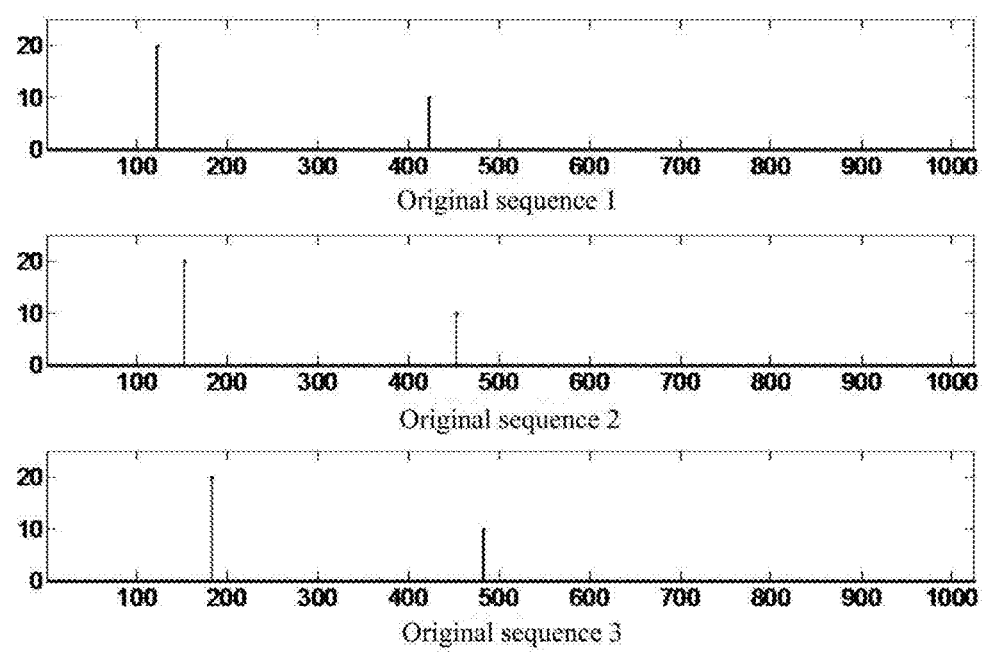
FIG. 3 is a schematic diagram of a three-frame time-sparse sequence according to an embodiment of the present invention.

First, a three-frame time-sparse sequence having a size of 1×1024 is generated, the amplitude value is 20, and the noise is $v \sim N(0, 0.5^2)$. The sequence is shown in FIG. 3.

In the present invention, signal reconstruction of one frame of data, two frames of data, and three frames of data is separately performed on the aforementioned three-frame sequence, and the reconstruction error and the running time of the reconstruction algorithm thereof are shown in the following Table 1.

TABLE 1

Comparison of algorithm running results for simulated data

| Experimental data | Mean Squared Error | Signal-to-noise ratio (dB) | Reconstruction time (s) for single frame |
|---|---|---|---|
| One frame of data | 0.3537 | 9.9057 | 3.211286 |
| Two frames of data | 0.2503 | 12.5663 | 2.015213 |
|  | 0.2849 | 10.7694 |  |
| Three frames of data | 0.2047 | 14.1031 | 1.562344 |
|  | 0.2544 | 11.6257 |  |
|  | 0.2029 | 13.8412 |  |

It can be seen from the above table that as the number of signal sequences increases, the signal reconstruction precision is higher, the signal-to-noise ratio is greater, and meanwhile the average algorithm running time for each frame of data is shorter. That is, the reconstruction algorithm considering the temporal correlation has a shorter algorithm running time than a reconstruction method for a single frame of data.

Figure 4:
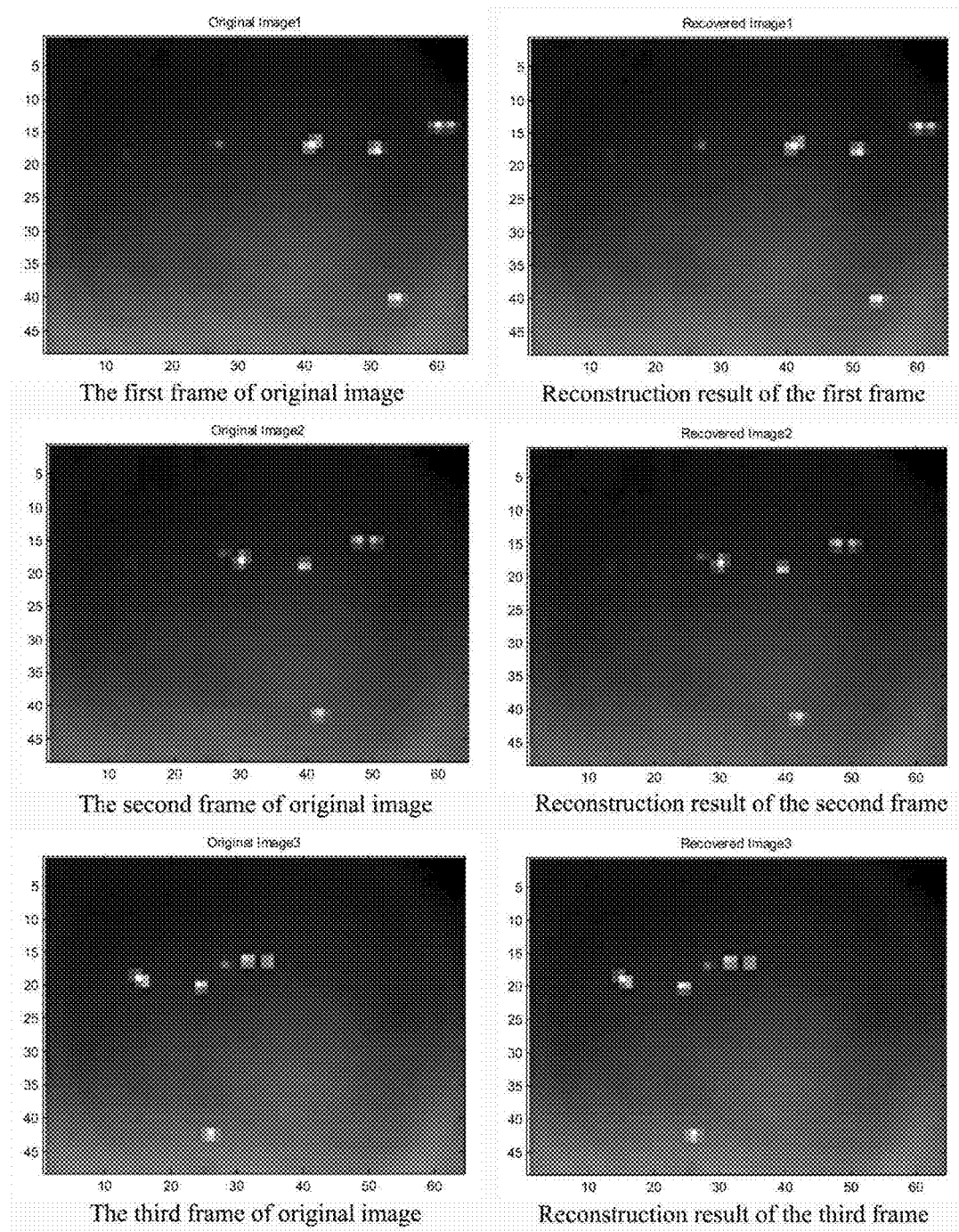
FIG. 4 is a schematic diagram illustrating comparison between original infrared images and reconstruction results according to an embodiment of the present invention.

In order to illustrate the effectiveness of the algorithm on actual data, the algorithm is verified using three consecutive frames of measured infrared images in the present invention. Since the images are collected in static state, in the experiment, first, morphological detection is performed on the experimental images to preliminarily detect targets, backgrounds and targets are separated and separately compressed, the image size is 48×64, and the recovery results of the three consecutive frames are shown in FIG. 4.

The reconstruction results of measured infrared data are shown in Table 2. The table lists several technical indexes in reconstruction of one frame of data, two frames of data, and three frames of data, including a mean squared error and a signal-to-noise ratio of a reconstructed image, and algorithm running time. It can be seen from the table that since the aforementioned algorithm considers correlation characteristics of images in time and integrates the correlation into the compressive sensing process, as the number of frames of images increases, the peak signal-to-noise ratio thereof is increased and the mean squared error is reduced, and meanwhile, the more the frames of images, the shorter the reconstruction time for each frame.

TABLE 2

Algorithm running results for measured infrared images

| Experimental data | Mean squared error | Signal-to-noise ratio | Reconstruction time (s) for single frame |
|---|---|---|---|
| One frame of data | 0.1423 | 52.8876 | 30.06 |
| Two frames of data | 0.0812 | 57.7547 | 26.13 |
|  | 0.0676 | 59.0322 |  |

TABLE 2-continued

Algorithm running results for measured infrared images

| Experimental data | Mean squared error | Signal-to-noise ratio | Reconstruction time (s) for single frame |
|---|---|---|---|
| Three frames of data | 0.0800 | 57.8909 | 23.89 |
|  | 0.0662 | 59.2067 |  |
|  | 0.0730 | 58.3149 |  |

According to an infrared image reconstruction method based on block-sparse compressive sensing and a system thereof provided in the present invention, in the process of reconstruction by compressive sensing, signals are reconstructed using a correlation of consecutive signals in time. In experiments, for simulated sequences and measured infrared images, as the integration of the time signal correlation, signals are reconstructed using multiple frames of information, such that the reconstruction precision of a single frame of signal can indeed be improved, and the algorithm running time is significantly reduced. The experimental results show that the reconstruction algorithm based on block-sparse Bayesian compressive sensing provided in the present invention is indeed an effective signal reconstruction method for such block-sparse signals having correlation characteristics in time.

It should be noted that the units included in the aforementioned embodiments are divided merely according to functional logic, but the present invention is not limited to the division, as long as corresponding functions can be realized; and specific names of the functional units are merely provided for the purpose of distinguishing the units from one another, but not intended to limit the protection scope of the present invention.

In addition, a person of ordinary skill in the art can understand that all or part of the steps in the method according to the aforementioned embodiments may be implemented by a program instructing relevant hardware. The corresponding program may be stored in a computer readable storage medium. The storage medium is, for example, a ROM/RAM, a magnetic disk, or an optical disk.

The above descriptions are merely preferred embodiments of the present invention, but not intended to limit the present invention. Any modifications, equivalent replacements, and improvements made within the spirit and principle of the present invention shall fall within the protection scope of the present invention.

What is claimed is:

1. An infrared image reconstruction method based on block-sparse compressive sensing, comprising:
   a block-sparse representation step: representing consecutive infrared small target image sequences as signals having block-sparse characteristics;
   a temporal correlation modeling step: modeling a temporal correlation of data between the consecutive infrared small target image sequences under a Bayesian framework; and
   a signal reconstruction and output step: reconstructing infrared small target images using a sparse learning algorithm and outputting final estimates of the signals.

2. The infrared image reconstruction method based on block-sparse compressive sensing according to claim 1, wherein the block-sparse representation step specifically comprises:
   representing a multiple-measurement vector model $Y=\Phi X+V$ using consecutive infrared small target image sequence signals and a block-sparse matrix, where the infrared small target image signals are $x, x \in \mathbb{R}^{M \times 1}$, the block-sparse matrix is $X=\{x_1, x_2, \ldots, x_L\}$, $X \in \mathbb{R}^{M \times L}$, $Y \triangleq [y^{(.1)}, \ldots, y^{(.L)}] \in \mathbb{R}^{N \times L}$ is an observation matrix, $X \triangleq [x^{(.1)}, \ldots, x^{(.L)}] \in \mathbb{R}^{M \times L}$, $\Phi \in \mathbb{R}_{N \times M}$ is a known dictionary matrix, V is a noise matrix, $y^{(.i)}$ is an $i^{th}$ column of Y, and $x^{(.i)}$ is an $i^{th}$ column of X; and
   convert the multiple-measurement vector model into a single-measurement vector model $y=Dx+v$, where in the multiple-measurement vector model, the block-sparse matrix X is constituted by consecutive frames $x_i (i=1, 2, \ldots, L)$ having a temporal correlation, $x^{(i.)} (i=1, \ldots, M)$ are independent of each other, $x^{(i.)}$ is an $i^{th}$ row of X, let $y=\text{vec}(Y^T) \in \mathbb{R}^{NL \times 1}$, $x=\text{vec}(X^T) \in \mathbb{R}^{ML \times 1}$, where $D=\Phi \otimes I_L$, $I_L$ is an L-dimension unit matrix, and x is a block-sparse signal and may be represented as $$x = \begin{bmatrix} \underbrace{x_1 \ldots x_L}_{x^T[1]} & \underbrace{x_2 \ldots x_{2L}}_{x^T[2]} & \cdots & \underbrace{x_{J-L+1} \ldots x_J}_{x^T[M]} \end{bmatrix}^T,$$

where $J=M \times L$.

3. The infrared image reconstruction method based on block-sparse compressive sensing according to claim 2, wherein the temporal correlation modeling step specifically comprises:
   in the multiple-measurement vector model, assuming $X_{i.}$ are independent of each other and comply with a Gaussian distribution: $p(X_{i.}; \gamma_i, B_i) \sim N(0, \gamma_i B_i)$, where a super-parameter $\gamma_i$ controls the sparseness of the vectors $X_{i.}$, and $B_i$ is a positive definite matrix that describes a time correlation structure of $X_{i.}$ and is a parameter to be estimated, assuming a priori of the sparse vector x is $p(x; \gamma_i, B_i) \sim N(0, \Sigma_0)$, and modeling a temporal correlation of data between the consecutive infrared small target image sequences under a Bayesian framework, where $\gamma_i$ is a non-negative super-parameter, $$\Sigma_0 = \begin{bmatrix} \gamma_1 B_1 & & \\ & \ddots & \\ & & \gamma_M B_M \end{bmatrix},$$

and the time structure of the signals is described with a prior density for constructing the matrix $B_i$.

4. The infrared image reconstruction method based on block-sparse compressive sensing according to claim 3, wherein the signal reconstruction and output step specifically comprises:
   under the condition that an observation y is known, obtaining a posterior estimate of the sparse vector x using a Bayesian method: $p(x|y; \sigma^2, \gamma_i, B_i) \sim N(\mu_x, \Sigma_x)$, where a Gaussian likelihood function of the observation y is:

$$p(y \mid x, \sigma^2) = (2\pi\sigma^2)^{-N/2} \exp\left(-\frac{1}{2\sigma^2} \|y - Dx\|^2\right),$$

where $$\mu_x = \frac{1}{\sigma^2} \Sigma_x D^T y$$

where and $\Sigma_x=\Sigma_0-\Sigma_0 D^T(\sigma^2 I+D\Sigma_0 D^T)^{-1}D\Sigma_0$; and estimating the super-parameter in the above equation through a maximum likelihood method or an expectation maximization method:

$$\gamma_i = \frac{Tr[B^{-1}(\Sigma_x^i + \mu_x^i(\mu_x^i)^T)]}{L}, i=1,\ldots,M,$$

$$B = \frac{1}{M}\sum_{i=1}^{M}\frac{\Sigma_x^i + \mu_x^i(\mu_x^i)^T}{\gamma_i}, i=1,\ldots,M,$$

$$\sigma^2 = \frac{\|y - D\mu_x\|_2^2 + \sigma'^2[ML - Tr(\Sigma_x\Sigma_0^{-1})]}{NL},$$

and outputting final estimates of the signals after the iteration ends.

5. An infrared image reconstruction system based on block-sparse compressive sensing, comprising:
   a block-sparse representation module, configured to represent consecutive infrared small target image sequences as signals having block-sparse characteristics;
   a temporal correlation modeling module, configured to model a temporal correlation of data between the consecutive infrared small target image sequences under a Bayesian framework; and
   a signal reconstruction and output module, configured to reconstruct infrared small target images using a sparse learning algorithm and output final estimates of the signals.

6. The infrared image reconstruction system based on block-sparse compressive sensing according to claim 5, wherein the block-sparse representation module is specifically configured to:
   represent a multiple-measurement vector model $Y=\Phi X+V$ using consecutive infrared small target image sequence signals and a block-sparse matrix, where the infrared small target image signals are $x, \tilde{x} \in \mathbb{R}^{M\times 1}$, the block-sparse matrix is $X=\{x_1, x_2, \ldots, x_L\}$, $X \in \mathbb{R}^{M\times L}$, $Y \triangleq [y^{(.1)}, \ldots, y^{(.L)}] \in \mathbb{R}^{N\times L}$ is an observation matrix, $X \triangleq [x^{(.1)}, \ldots, x^{(.L)}] \in \mathbb{R}^{M\times L}$, $\Phi \in \mathbb{R}^{N\times M}$ is a known dictionary matrix, V is a noise matrix, $y^{(.i)}$ is an $i^{th}$ column of Y, and $x^{(.i)}$ is an $i^{th}$ column of X; and
   convert the multiple-measurement vector model into a single-measurement vector model $y=Dx+v$, where in the multiple-measurement vector model, the block-sparse matrix X is constituted by consecutive frames $x_i(i=1, 2, \ldots, L)$ having a temporal correlation, $x^{(i.)}(i=1, \ldots, M)$ are independent of each other, $x^{(i.)}$ is an $i^{th}$ row of X, let $y=\text{vec}(Y^T) \in \mathbb{R}^{NL\times 1}$, $x=\text{vec}(X^T) \in \mathbb{R}^{ML\times 1}$, where $D=\Phi \otimes I_L$, $I_L$ is an L-dimension unit matrix, and x is a block-sparse signal and may be represented as $$x = [\underbrace{x_1 \ldots x_L}_{x^T[1]} \underbrace{x_2 \ldots x_{2L}}_{x^T[2]} \ldots \underbrace{x_{J-L+1} \ldots x_J}_{x^T[M]}]^T,$$

where $J=M\times L$.

7. The infrared image reconstruction method based on block-sparse compressive sensing according to claim 6, wherein the temporal correlation modeling module is specifically configured to:
   in the multiple-measurement vector model, assume $X_{i.}$ are independent of each other and comply with a Gaussian distribution: $p(X_{i.};\gamma_i,B_i)\sim N(0,\gamma_i B_i)$, where a super-parameter $\gamma_i$ controls the sparseness of the vectors $X_{i.}$, and $B_i$ is a positive definite matrix that describes a time correlation structure of $X_{i.}$ and is a parameter to be estimated, assume a priori of the sparse vector x is $p(x;\gamma_i,B_i)\sim N(0,\Sigma_0)$, and model a temporal correlation of data between the consecutive infrared small target image sequences under a Bayesian framework, where $\gamma_i$ is a non-negative super-parameter, $$\Sigma_0 = \begin{bmatrix} \gamma_1 B_1 & & \\ & \ddots & \\ & & \gamma_M B_M \end{bmatrix},$$

and the time structure of the signals is described with a prior density for constructing the matrix $B_i$.

8. The infrared image reconstruction method based on block-sparse compressive sensing according to claim 7, wherein the signal reconstruction and output module is specifically configured to:
   under the condition that an observation y is known, obtain a posterior estimate of the sparse vector x using a Bayesian method: $p(x|y;\sigma^2,\gamma_i,B_i)\sim N(\mu_x,\Sigma_x)$, where a Gaussian likelihood function of the observation y is:

$$p(y|x,\sigma^2) = (2\pi\sigma^2)^{-N/2}\exp\left(-\frac{1}{2\sigma^2}\|y-Dx\|^2\right),$$

where $$\mu_x = \frac{1}{\sigma^2}\Sigma_x D^T y$$

where and $\Sigma_x=\Sigma_0-\Sigma_0 D^T(\sigma^2 I+D\Sigma_0 D^T)^{-1}D\Sigma_0$; and
   estimate the super-parameter in the above equation through a maximum likelihood method or an expectation maximization method:

$$\gamma_i = \frac{Tr[B^{-1}(\Sigma_x^i + \mu_x^i(\mu_x^i)^T)]}{L}, i=1,\ldots,M,$$

$$B = \frac{1}{M}\sum_{i=1}^{M}\frac{\Sigma_x^i + \mu_x^i(\mu_x^i)^T}{\gamma_i}, i=1,\ldots,M,$$

$$\sigma^2 = \frac{\|y - D\mu_x\|_2^2 + \sigma'^2[ML - Tr(\Sigma_x\Sigma_0^{-1})]}{NL},$$

and output final estimates of the signals after the iteration ends.

* * * * *